United States Patent
Yoshida et al.

(10) Patent No.: US 9,447,508 B2
(45) Date of Patent: *Sep. 20, 2016

(54) HYDROGEN PRODUCTION DEVICE AND METHOD FOR PRODUCING HYDROGEN

(75) Inventors: Akihito Yoshida, Osaka (JP); Shunsuke Sata, Osaka (JP); Masaki Kaga, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 766 days.

This patent is subject to a terminal disclaimer.

(21) Appl. No.: 13/876,033

(22) PCT Filed: Aug. 9, 2011

(86) PCT No.: PCT/JP2011/068170

§ 371 (c)(1),
(2), (4) Date: Mar. 26, 2013

(87) PCT Pub. No.: WO2012/043069

PCT Pub. Date: Apr. 5, 2012

(65) Prior Publication Data

US 2013/0180862 A1  Jul. 18, 2013

(30) Foreign Application Priority Data

Sep. 28, 2010 (JP) ................ 2010-217630

(51) Int. Cl.
 *C25B 1/04* (2006.01)
 *C25B 1/00* (2006.01)
 (Continued)

(52) U.S. Cl.
 CPC ............ *C25B 1/04* (2013.01); *C01B 3/042* (2013.01); *C01B 13/0207* (2013.01);
 (Continued)

(58) Field of Classification Search
 CPC ......... C25B 1/04; C25B 1/003; C01B 3/042; C01B 13/0207; H01L 31/048; Y02E 60/366; Y02E 10/50; Y02E 60/364
 USPC .......................................... 205/340; 204/242
 See application file for complete search history.

(56) References Cited

U.S. PATENT DOCUMENTS

| 4,011,149 A | 3/1977 | Nozik |
| 4,021,323 A | 5/1977 | Kilby et al. |

(Continued)

FOREIGN PATENT DOCUMENTS

| GB | 2 414 243 A | 11/2005 |
| JP | 63-150869 A | 6/1988 |

(Continued)

OTHER PUBLICATIONS

Delahoy et al, A One-Unit Photovoltaic Electrolysis System Based on a Triple Stack of Amorphous Silicon (pin) Cells, International Journal of Hydrogen Energy, Elsevier Science Publishers B.V., Barking, GB, vol. 10, No. 2, Jan. 1, 1985.

(Continued)

*Primary Examiner* — Colleen M Raphael
(74) *Attorney, Agent, or Firm* — Nixon & Vanderhye P.C.

(57) ABSTRACT

A hydrogen production device of the present invention includes a photoelectric conversion portion having a light-receiving surface and a back surface, a first electrolysis electrode provided on the back surface, and a second electrolysis electrode provided on the back surface. As a result of reception of light by the photoelectric conversion portion, a potential difference is generated between a first area on the back surface and a second area on the back surface, the first area becomes electrically connected to the first electrolysis electrode, and the second area becomes electrically connected to the second electrolysis electrode. When the first electrolysis electrode and the second electrolysis electrode contact an electrolyte solution, the first electrolysis electrode forms a hydrogen generation portion that generates $H_2$ from the electrolyte solution using an electromotive force generated as a result of reception of light by the photoelectric conversion portion and the second electrolysis electrode forms an oxygen generation portion that generates $O_2$ from the electrolyte solution using the electromotive force.

17 Claims, 4 Drawing Sheets

(51) Int. Cl.
*H01L 31/048* (2014.01)
*C01B 3/04* (2006.01)
*C01B 13/02* (2006.01)

(52) U.S. Cl.
CPC ............ *C25B 1/003* (2013.01); *H01L 31/048* (2013.01); *Y02E 10/50* (2013.01); *Y02E 60/364* (2013.01); *Y02E 60/366* (2013.01)

(56) References Cited

U.S. PATENT DOCUMENTS

| | | | |
|---|---|---|---|
| 4,090,933 | A | 5/1978 | Nozik |
| 4,094,751 | A | 6/1978 | Nozik |
| 4,211,620 | A | 7/1980 | Fowler |
| 4,466,869 | A * | 8/1984 | Ayers ................. C25B 1/003 205/340 |
| 4,492,743 | A | 1/1985 | Howe |
| 4,525,436 | A | 6/1985 | Yamazaki |
| 4,528,252 | A | 7/1985 | Yamazaki |
| 4,634,641 | A | 1/1987 | Nozik |
| 4,643,817 | A | 2/1987 | Appleby |
| 4,790,916 | A | 12/1988 | Murphy et al. |
| 4,793,910 | A | 12/1988 | Smokin et al. |
| 5,785,768 | A | 7/1998 | Nakata |
| 6,198,037 | B1 | 3/2001 | Nakata |
| 6,936,143 | B1 | 8/2005 | Graetzel et al. |
| 7,271,334 | B2 | 9/2007 | Gratzel et al. |
| 8,337,708 | B2 | 12/2012 | Lin |
| 2005/0139252 | A1 | 6/2005 | Shim |
| 2005/0211290 | A1 | 9/2005 | Deng et al. |
| 2008/0073205 | A1 | 3/2008 | Adiga et al. |
| 2008/0213641 | A1 | 9/2008 | Ostermann et al. |
| 2008/0223439 | A1 | 9/2008 | Deng et al. |
| 2009/0269875 | A1 | 10/2009 | Kato |
| 2011/0056550 | A1 | 3/2011 | Choi |
| 2011/0186112 | A1 | 8/2011 | Aernouts |
| 2012/0168318 | A1* | 7/2012 | Ueno ................. C25B 1/003 205/340 |
| 2013/0015076 | A1 | 1/2013 | Yoshida et al. |
| 2013/0175180 | A1* | 7/2013 | Esposito ............ C25B 1/003 205/340 |

FOREIGN PATENT DOCUMENTS

| | | |
|---|---|---|
| JP | 05-166921 | 7/1993 |
| JP | 2000-192275 | 7/2000 |
| JP | 2002-249031 | 9/2002 |
| JP | 2003-288955 | 10/2003 |
| JP | 2004-197167 | 7/2004 |
| JP | 2004-315942 A | 11/2004 |
| JP | 2005-324152 | 11/2005 |
| JP | 2006-508253 | 3/2006 |
| JP | 2006-89336 | 4/2006 |
| JP | 2008-507464 | 3/2008 |
| JP | 2009-274891 | 11/2009 |
| JP | 2010247109 A * | 11/2010 |
| WO | WO 02/09876 | 2/2002 |
| WO | WO 2005/113859 | 12/2005 |

OTHER PUBLICATIONS

International Search Report for PCT/JP2011/068170 mailed Nov. 22, 2011.
N. Lewis et al., "Powering the Planet: Chemical Challenges in Solar Energy Utilization", PNAS, Oct. 24, 2006, vol. 103, No. 43, pp. 15729-15735.
G.H. Lin et al., "One Step to Produce Hydrogen by a Triple Stack Amorphous Silicon Solar Cell", Applied Phys. Lett. 55 (4), Jul. 24, 1989, 1 page.
Y. Yamada et al., "One Ship Photovoltaic Water Electrolysis Device", International Journal of Hydrogen Energy (2003), pp. 1167-1169.
International Search Report for PCT/JP2010/072899 mailed Mar. 22, 2011.
Office Action mailed Aug. 28, 2014 in U.S. Appl. No. 13/577,505.
S. Yamane et al., "Efficient Solar Water Splitting with a Composite "n-Si/p-CuI/n-i-p a-Si/n-p Gap/RuO$_2$'", Journal of Physical Chemistry (2009), 113, pp. 14575-14581.
Office Action mailed Feb. 18, 2015 in U.S. Appl. No. 13/577,505.
Final Office Action mailed Oct. 23, 2015 in U.S. Appl. No. 13/577,505.

* cited by examiner

FIG. 8 ically used, the energy use efficiency is
HYDROGEN PRODUCTION DEVICE AND METHOD FOR PRODUCING HYDROGEN This application is the U.S. national phase of International Application No. PCT/JP2011/068170 filed 9 Aug. 2011 which designated the U.S. and claims priority to JP 2010-217630 filed 28 Sep. 2010, the entire contents of each of which are hereby incorporated by reference.

TECHNICAL FIELD

The present invention relates to a hydrogen production device and a method for producing hydrogen.

BACKGROUND ART

Recently, use of renewable energy has been desired from the standpoint of depletion of fossil fuel resources, suppression of greenhouse gas emissions, etc. Renewable energy is generated from various energy sources such as sunlight, hydraulic power, wind power, geothermal heat, tidal power, and biomass. Among these renewable energy sources, sunlight has a large amount of energy that can be utilized and has relatively small geographic restrictions as compared with other renewable energy sources. Thus, a technique for efficiently generating usable energy from sunlight has been desired to be developed and widely used at an early stage.

Examples of the form of usable energy generated from sunlight include electrical energy produced by using a solar cell or a solar thermal turbine, thermal energy obtained by collecting solar energy in a heating medium, and storable fuel energy such as liquid fuel or hydrogen produced by reducing a substance with sunlight. Although many solar cell techniques and techniques for utilizing solar heat have already been practically used, the energy use efficiency is still low and the cost for producing electricity and heat is still high. Therefore, techniques for solving these problems have been developed. Furthermore, although these energy forms such as electricity and heat can be used for compensating for a short-term energy fluctuation, they have problems in that, for example, it is very difficult to compensate for a long-term fluctuation such as a seasonal fluctuation, and the operating ratio of power generation facilities may be decreased with an increase in the amount of energy. In contrast, storing energy as a substance such as liquid fuel or hydrogen is very effective as a technique for efficiently compensating for a long-term fluctuation and for increasing the operating ratio of power generation facilities. Accordingly, this is an indispensable technique for maximizing the energy use efficiency and markedly reducing the amount of carbon dioxide emission in the future.

The forms of storable fuel are broadly classified into liquid fuel such as hydrocarbons, gas fuel such as biogas and hydrogen, solid fuel such as wood pellets derived from biomass and metals reduced by sunlight, etc. Liquid fuel is advantageous from the standpoint of ease of construction of the infrastructure and energy density. Gas fuel such as hydrogen is advantageous from the standpoint of improving the total use efficiency in combination with a fuel cell or the like. Solid fuel is advantageous from the standpoint of storage possibility and energy density. Thus, each of the forms has advantages and disadvantages. However, a technique for producing hydrogen by decomposing water by sunlight has particularly attracted attention because water, which is easily available, can be utilized as a raw material.

Examples of the method for producing hydrogen by using water as a raw material and utilizing solar energy include a photolysis method in which platinum is supported on a photocatalyst such as titanium oxide, this substance is put in water, and light irradiation is conducted to perform charge separation in a semiconductor, thus reducing a proton in an electrolyte solution and oxidizing water in the electrolyte solution; a thermal decomposition method in which water is directly decomposed at a high temperature by using thermal energy of a high-temperature gas furnace or the like or water is indirectly decomposed in combination with oxidation-reduction of a metal or the like; a biological method in which the metabolism of microorganisms, such as algae which utilize light, is used; a water electrolysis method in which electricity generated by a solar cell is combined with a hydrogen production device for electrolysis of water; and a photovoltaic method in which a hydrogen generation catalyst and an oxygen generation catalyst are supported on a photoelectric conversion material used in a solar cell, and electrons and holes produced by photoelectric conversion are used in a reaction in the presence of the hydrogen generation catalyst and the oxygen generation catalyst. Among these methods, the photolysis method, the biological method, and the photovoltaic method are believed to have a possibility of producing a compact hydrogen production device by integrating a photoelectric conversion portion and a hydrogen generation portion. However, in view of the conversion efficiency of solar energy, the photovoltaic method is believed to be one of the most plausible techniques for practical use.

Examples of the hydrogen production device in which photoelectric conversion is integrated with hydrogen generation by the photolysis method or the photovoltaic method have been disclosed. Regarding the photolysis method, for example, PTL 1 discloses a device including a photocatalytic electrode composed of titanium oxide to which a ruthenium complex is adsorbed and a platinum electrode, in which oxidation and reduction of iodine or iron are used. According to PTL 2, an integrated structure is realized by connecting two photocatalyst layers in tandem, connecting a platinum counter electrode, and interposing an ion-exchange membrane therebetween. Regarding the photovoltaic method, a concept of a hydrogen production device in which a photoelectric conversion portion, a hydrogen generation portion, and an oxygen generation portion are integrated with each other has been disclosed (NPL 1). According to this literature, charge separation is conducted in the photoelectric conversion portion, and hydrogen generation and oxygen generation are conducted by using corresponding catalysts. The photoelectric conversion portion is composed of a material used in a solar cell. For example, according to NPL 2, charge separation is conducted on three silicon p-i-n layers, hydrogen generation is conducted in the presence of a platinum catalyst, and oxygen generation is conducted in the presence of ruthenium oxide. According to PTL 3 and NPL 3, an integrated hydrogen production device is produced by stacking a hydrogen generation catalyst (NiFeO) and three silicon p-i-n layers in parallel on a substrate, and further supporting an oxygen generation catalyst (Co—Mo) on a silicon layer.

CITATION LIST

Patent Literature

PTL 1: Japanese Unexamined Patent Application Publication No. 2006-89336

PTL 2: Japanese Unexamined Patent Application Publication (Translation of PCT Application) No. 2004-504934

PTL 3: Japanese Unexamined Patent Application Publication No. 2003-288955
PTL 4: Japanese Unexamined Patent Application Publication No. 2004-197167

Non Patent Literature

NPL 1: Proceedings of the National Academy of Sciences of the United States of America, 2006, Vol. 43, pp. 15729-15735
NPL 2: Applied Physics Letters, 1989, Vol. 55, pp. 386-387
NPL 3: International Journal of Hydrogen Energy, 2003, Vol. 28, pp. 1167-1169

SUMMARY OF INVENTION

Technical Problem

As described above, some studies on the structure of a hydrogen generation device in which photoelectric conversion is integrated with hydrogen generation have already been disclosed. However, in order to produce hydrogen at a higher efficiency, it is necessary to increase the use ratio of light to the maximum. For example, when gas is generated on a light-receiving surface in a device, incident light is scattered by the generated gas and thus the incident light cannot be sufficiently used, resulting in a serious problem of a decrease in the light use efficiency. Furthermore, when a catalyst is supported on a light-receiving surface of a photoelectric conversion portion, the incident light is reflected or absorbed by the catalyst. This also causes a problem of a decrease in the light use ratio. In addition, in order to prevent light from being scattered, a method has also been studied in which a light-receiving surface of a photoelectric conversion portion is electrically connected to an oxygen catalyst with an electrode film. However, since the area of the photoelectric conversion portion is limited by the area of another member (such as an oxygen generation catalyst) in terms of structure, it is difficult to avoid a problem of a decrease in the light use efficiency.

The present invention has been made in view of the above circumstances. The present invention provides a hydrogen production device that has a high light use efficiency and that can produce hydrogen with high efficiency.

Solution to Problem

The present invention provides a hydrogen production device including a photoelectric conversion portion having a light-receiving surface and a back surface, a first electrolysis electrode provided on the back surface, and a second electrolysis electrode provided on the back surface. As a result of reception of light by the photoelectric conversion portion, a potential difference is generated between a first area on the back surface and a second area on the back surface, the first area becomes electrically connected to the first electrolysis electrode, and the second area becomes electrically connected to the second electrolysis electrode. When the first electrolysis electrode and the second electrolysis electrode contact an electrolyte solution, the first electrolysis electrode forms a hydrogen generation portion that generates $H_2$ from the electrolyte solution using an electromotive force generated as a result of reception of light by the photoelectric conversion portion and the second electrolysis electrode forms an oxygen generation portion that generates $O_2$ from the electrolyte solution using the electromotive force.

Advantageous Effects of Invention

According to the present invention, a potential difference can be generated between the first area and the second area on the back surface of the photoelectric conversion portion by causing light to be incident on the light-receiving surface of the photoelectric conversion portion. As a result, a potential difference can also be generated between the first electrolysis electrode that is electrically connected to the first area and the second electrolysis electrode that is electrically connected to the second area. By bringing an electrolyte solution into contact with the first electrolysis electrode and the second electrolysis electrode between which the potential difference is generated, $H_2$ can be generated from the electrolyte solution in one of the first electrolysis electrode and the second electrolysis electrode and $O_2$ can be generated from the electrolyte solution in the other electrolysis electrode. The generated $H_2$ is collected, thus producing hydrogen.

According to the present invention, since the hydrogen generation portion and the oxygen generation portion are formed on the back surface of the photoelectric conversion portion, light can enter the light-receiving surface without passing through the electrolyte solution, thus preventing the incident light from being absorbed or scattered by the electrolyte solution. Consequently, the amount of light incident on the photoelectric conversion portion can be increased to increase the light use efficiency.

In addition, according to the present invention, since the hydrogen generation portion and the oxygen generation portion are formed on the back surface of the photoelectric conversion portion, light incident on the light-receiving surface is not absorbed or scattered by the hydrogen generation portion and the oxygen generation portion, and hydrogen and oxygen generated therefrom. Consequently, the amount of light incident on the photoelectric conversion portion can be increased to increase the light use efficiency.

According to the present invention, since the hydrogen generation portion and the oxygen generation portion are formed on the back surface of the photoelectric conversion portion, the light-receiving surface of the photoelectric conversion portion can be provided on most of a surface of the hydrogen production device, the surface receiving light. Consequently, the light use efficiency can be further increased.

According to the present invention, since the photoelectric conversion portion, the hydrogen generation portion, and the oxygen generation portion are provided in the same device, the hydrogen production cost can be reduced as compared with an existing combination of a solar cell and a water electrolysis device.

According to the present invention, a potential difference is generated between the first area and the second area on the back surface as a result of reception of light by the photoelectric conversion portion. Therefore, the first area and the second area can be easily electrically connected to the first electrolysis electrode and the second electrolysis electrode, respectively, which are provided on the back surface of the photoelectric conversion portion, and the production cost can be reduced. In the case where a potential difference is generated between a light-receiving surface and a back surface as a result of reception of light by a photoelectric conversion portion, the area of the light-receiving surface of the photoelectric conversion portion may be decreased because the light-receiving surface is electrically connected to a first electrolysis electrode or a second electrolysis electrode. In contrast, according to the present invention, since a potential difference is generated between the two areas on the back surface of the photoelectric conversion portion, a larger area of the light-receiving surface of the photoelectric conversion portion can be ensured to increase the amount of light received. Furthermore, since a conduction distance between the photoelectric conversion portion and the first electrolysis electrode or the second electrolysis electrode can be made small, the internal resistance can be further reduced.

DESCRIPTION OF EMBODIMENTS

A hydrogen production device of the present invention includes a photoelectric conversion portion having a light-receiving surface and a back surface, a first electrolysis electrode provided on the back surface, and a second electrolysis electrode provided on the back surface. As a result of reception of light by the photoelectric conversion portion, a potential difference is generated between a first area on the back surface and a second area on the back surface, the first area becomes electrically connected to the first electrolysis electrode, and the second area becomes electrically connected to the second electrolysis electrode. When the first electrolysis electrode and the second electrolysis electrode contact an electrolyte solution, the first electrolysis electrode forms a hydrogen generation portion that generates $H_2$ from the electrolyte solution using an electromotive force generated as a result of reception of light by the photoelectric conversion portion and the second electrolysis electrode forms an oxygen generation portion that generates $O_2$ from the electrolyte solution using the electromotive force.

The term "hydrogen production device" refers to a device that can produce hydrogen from an electrolyte solution containing water.

The term "photoelectric conversion portion" refers to a portion that receives light and that generates an electromotive force.

The term "light-receiving surface" refers to a surface of the photoelectric conversion portion on which light is incident.

The term "back surface" refers to a back surface of the light-receiving surface.

In the hydrogen production device of the present invention, the photoelectric conversion portion is preferably composed of at least one semiconductor material having an n-type semiconductor portion and a p-type semiconductor portion, and one of the first area and the second area is preferably a part of the n-type semiconductor portion and the other is preferably a part of the p-type semiconductor portion.

With this structure, a p-n junction, a p-i-n junction, an n-p-p$^+$ junction, or a p-n-n$^+$ junction can be formed in the photoelectric conversion portion. Accordingly, when the photoelectric conversion portion receives light, a potential difference can be generated between the first area and the second area on the back surface of the photoelectric conversion portion.

The hydrogen production device of the present invention preferably further includes an insulating portion disposed partially between the back surface of the photoelectric conversion portion and the first electrolysis electrode and partially between the back surface and the second electrolysis electrode. The first electrolysis electrode and the second electrolysis electrode preferably become electrically connected to the n-type semiconductor portion or the p-type semiconductor portion through the first and second areas, respectively, where the insulating portion is not provided.

With this structure, electrons and holes formed as a result of reception of light by the photoelectric conversion portion can be efficiently separated to further increase the photoelectric conversion efficiency.

The hydrogen production device of the present invention preferably further includes a first conductive portion that is provided between the insulating portion and the first electrolysis electrode and that becomes electrically connected to the n-type semiconductor portion or the p-type semiconductor portion through the first area, and a second conductive portion that is provided between the insulating portion and the second electrolysis electrode and that becomes electrically connected to the n-type semiconductor portion or the p-type semiconductor portion through the second area.

With this structure, it is possible to reduce the internal resistance when the electromotive force generated as a result of reception of light by the photoelectric conversion portion is output to the first electrolysis electrode and the second electrolysis electrode.

In the hydrogen production device of the present invention, the photoelectric conversion portion preferably has a plurality of p-i-n junctions, p-n junctions, n-p-p$^+$ junctions, or p-n-n$^+$ junctions, and the p-i-n junctions, the p-n junctions, the n-p-p$^+$ junctions, or the p-n-n$^+$ junctions are preferably connected in series and preferably supply the electromotive force generated by reception of light to the first electrolysis electrode and the second electrolysis electrode.

With this structure, an electromotive force necessary for decomposing water can be generated as a result of reception of light by the photoelectric conversion portion.

In the hydrogen production device of the present invention, the photoelectric conversion portion preferably includes a plurality of semiconductor substrates each having a p-i-n junction, a p-n junction, an n-p-p$^+$ junction, or a p-n-n$^+$ junction.

With this structure, a photoelectric conversion portion having p-i-n junctions or the like that are connected in series can be formed by connecting a plurality of semiconductor substrates in series.

In the hydrogen production device of the present invention, the hydrogen generation portion preferably includes a catalyst for a reaction to generate $H_2$ from the electrolyte solution, and the oxygen generation portion preferably includes a catalyst for a reaction to generate $O_2$ from the electrolyte solution.

With this structure, the reaction rate of the reaction to generate $H_2$ from the electrolyte solution in the hydrogen generation portion can be increased, and the reaction rate of the reaction to generate $O_2$ from the electrolyte solution in the oxygen generation portion can be increased. Thus, $H_2$ can be more efficiently produced by the electromotive force generated in the photoelectric conversion portion to improve the light use efficiency.

In the hydrogen production device of the present invention, at least one of the hydrogen generation portion and the oxygen generation portion preferably has a catalyst surface area larger than the area of the light-receiving surface.

With this structure, hydrogen or oxygen can be more efficiently generated by the electromotive force generated in the photoelectric conversion portion.

In the hydrogen production device of the present invention, at least one of the hydrogen generation portion and the oxygen generation portion is preferably composed of a porous conductor on which a catalyst is supported.

With this structure, the catalyst surface area of at least one of the first electrolysis electrode and the second electrolysis electrode can be increased, and oxygen or hydrogen can be more efficiently generated. Furthermore, the use of a porous conductor can suppress a change in the electric potential due to a current flowing between the photoelectric conversion portion and the catalyst. Thus, hydrogen or oxygen can be more efficiently generated.

In the hydrogen production device of the present invention, the hydrogen generation portion preferably includes, as a hydrogen generation catalyst, at least one of Pt, Ir, Ru, Pd, Rh, Au, Fe, Ni, and Se.

With this structure, hydrogen can be generated at a higher reaction rate by the electromotive force generated in the photoelectric conversion portion.

In the hydrogen production device of the present invention, the oxygen generation portion preferably includes, as an oxygen generation catalyst, at least one of Mn, Ca, Zn, Co, and Ir.

With this structure, oxygen can be generated at a higher reaction rate by the electromotive force generated in the photoelectric conversion portion.

In the hydrogen production device of the present invention, the photoelectric conversion portion is preferably disposed on a light-transmissive substrate, a top plate is preferably further provided above the first electrolysis electrode and the second electrolysis electrode so as to face the substrate, and a space is preferably provided between the top plate, and the first electrolysis electrode and second electrolysis electrode.

With this structure, the electrolyte solution can be introduced between the top plate and the first electrolysis electrode and between the top plate and the second electrolysis electrode, and $H_2$ and $O_2$ can be more efficiently generated from the electrolyte solution in the first electrolysis electrode and the second electrolysis electrode.

The hydrogen production device of the present invention preferably further includes a partition wall that separates a space between the first electrolysis electrode and the top plate from a space between the second electrolysis electrode and the top plate.

With this structure, hydrogen and oxygen generated in the first electrolysis electrode and the second electrolysis electrode, respectively, can be separated, and hydrogen can be efficiently collected.

In the hydrogen production device of the present invention, the partition wall preferably includes an ion exchanger.

With this structure, it is possible to eliminate the imbalance in the proton concentration between the electrolyte solution introduced into an upper space of the first electrolysis electrode and the electrolyte solution introduced into an upper space of the second electrolysis electrode. Thus, hydrogen and oxygen can be stably generated.

In the hydrogen production device of the present invention, the photoelectric conversion portion preferably includes at least one semiconductor substrate having an n-type semiconductor portion and a p-type semiconductor portion, the n-type semiconductor portion is preferably formed by diffusing or ion-implanting an n-type impurity from the back surface of the semiconductor substrate, and the p-type semiconductor portion is preferably formed by diffusing or ion-implanting a p-type impurity from the back surface of the semiconductor substrate.

With this structure, it is possible to easily form a photoelectric conversion portion that has an n-type semiconductor portion and a p-type semiconductor portion and that generates a potential difference between the first area and the second area on the back surface as a result of reception of light.

In the hydrogen production device of the present invention, the photoelectric conversion portion preferably includes at least one semiconductor substrate having a plurality of p-i-n junctions, p-n junctions, n-p-p$^+$ junctions, or p-n-n$^+$ junctions, and the p-i-n junctions, the p-n junctions, the n-p-p$^+$ junctions, or the p-n-n$^+$ junctions are preferably separated by a trench isolation.

With this structure, a photoelectric conversion portion having p-i-n junctions or the like that are connected in series can be formed.

The present invention also provides a method for producing hydrogen, the method including arranging the hydrogen production device of the present invention such that the light-receiving surface is tilted with respect to a horizontal surface, introducing an electrolyte solution from a lower portion of the hydrogen production device into the hydrogen production device, causing sunlight to be incident on the light-receiving surface to generate hydrogen and oxygen from the hydrogen generation portion and the oxygen generation portion, respectively, and discharging the hydrogen and oxygen from an upper portion of the hydrogen production device.

According to the method for producing hydrogen of the present invention, hydrogen can be produced by utilizing sunlight at a low cost.

An embodiment of the present invention will now be described with reference to the drawings. Structures illustrated in the drawings and described below are only illustrative, and the scope of the present invention is not limited to the structures illustrated in the drawings and described below.

Structure of Hydrogen Production Device

Figure 1:
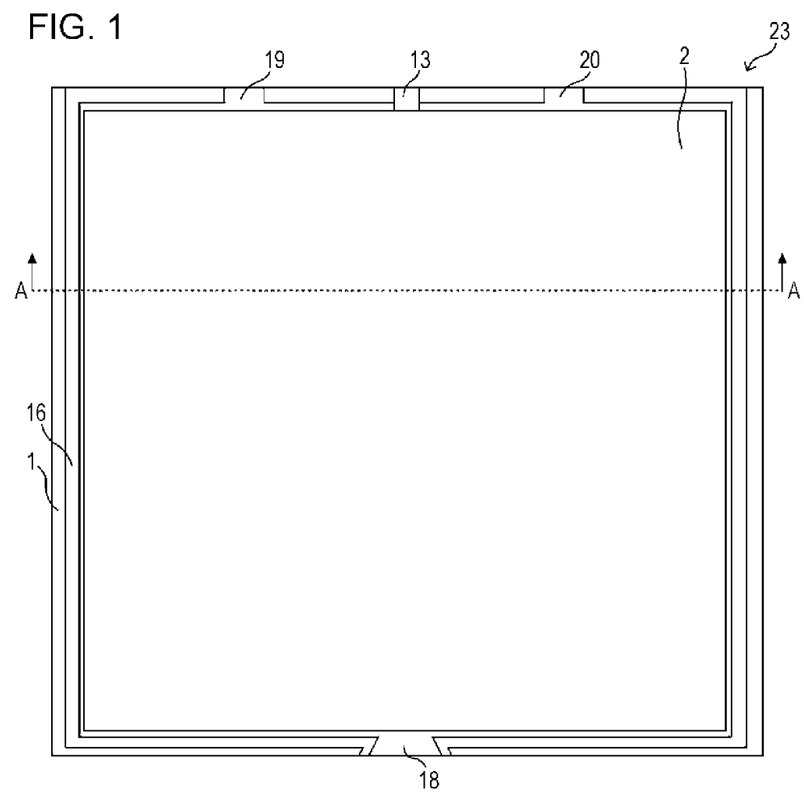
FIG. 1 is a schematic plan view illustrating a structure of a hydrogen production device according to an embodiment of the present invention.
Figure 2:
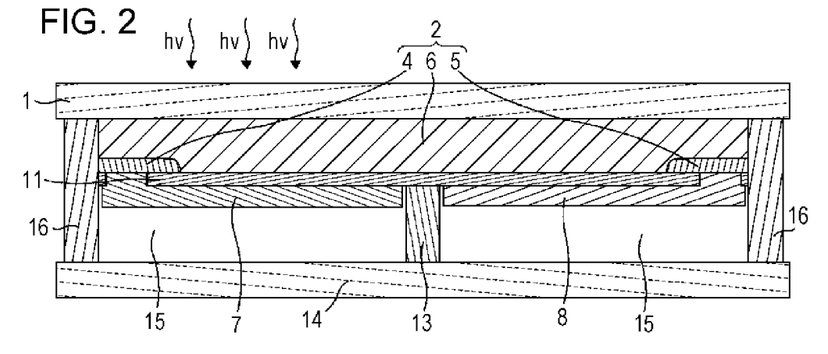
FIG. 2 is a schematic cross-sectional view taken along dotted line A-A of FIG. 1.
Figure 3:
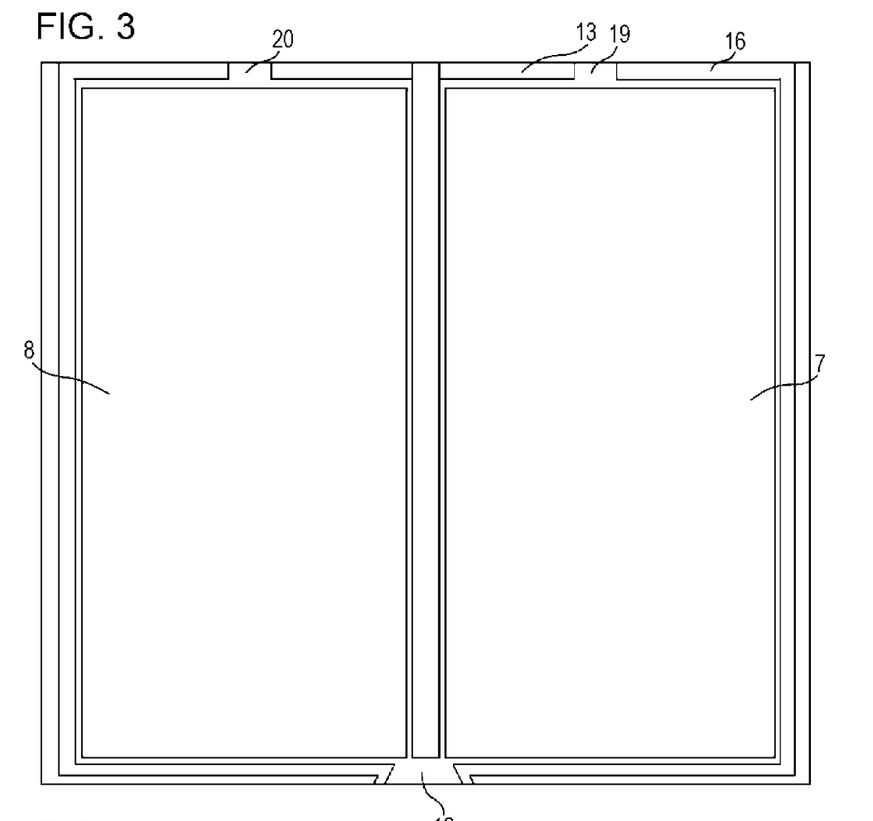
FIG. 3 is a schematic back surface view illustrating a structure of a hydrogen production device according to an embodiment of the present invention.

FIG. 1 illustrates a structure of a hydrogen production device according to an embodiment of the present invention, and is a schematic plan view viewed from the light-receiving surface side of a photoelectric conversion portion. FIG. 2 is a schematic cross-sectional view taken along dotted line A-A of FIG. 1. FIG. 3 illustrates a structure of the hydrogen production device according to an embodiment of the present invention, and is a schematic back surface view viewed from the back surface side of the photoelectric conversion portion.

A hydrogen production device 23 according to this embodiment includes a photoelectric conversion portion 2 having a light-receiving surface and a back surface, a first electrolysis electrode 8 provided on the back surface, and a second electrolysis electrode 7 provided on the back surface. As a result of reception of light by the photoelectric conversion portion 2, a potential difference is generated between a first area and a second area on the back surface, the first area becomes electrically connected to the first electrolysis electrode 8, and the second area becomes electrically connected to the second electrolysis electrode 7. When the first and second electrolysis electrodes contact an electrolyte solution, the first electrolysis electrode 8 forms a hydrogen generation portion that generates $H_2$ from the electrolyte solution using an electromotive force generated as a result of reception of light by the photoelectric conversion portion 2, and the second electrolysis electrode 7 forms an oxygen generation portion that generates $O_2$ from the electrolyte solution using the electromotive force.

The hydrogen production device 23 according to this embodiment may include a substrate 1, an insulating portion 11, a partition wall 13, a top plate 14, an electrolyte solution path 15, a sealing member 16, a water inlet 18, a first gas outlet 20, a second gas outlet 19, and first to third conductive portions.

The hydrogen production device according to this embodiment will now be described.

1. Substrate

The substrate 1 may be provided in the hydrogen production device 23 according to this embodiment. The photoelectric conversion portion 2 may be provided on the light-transmissive substrate 1 so that the light-receiving surface is disposed on the substrate 1 side. In the case where the photoelectric conversion portion 2 is formed of a semiconductor substrate or the like and has a certain strength, the substrate 1 may be omitted. In the case where the photoelectric conversion portion 2 can be formed on a flexible material such as a resin film, the substrate 1 may be omitted.

The substrate 1 is a member that can function as a base for constituting the hydrogen production device. In order to receive sunlight on the light-receiving surface of the photoelectric conversion portion 2, the substrate 1 is preferably transparent and has a high light transmittance. However, the light transmittance of the substrate 1 is not limited as long as the substrate 1 has a structure in which light can be efficiently incident on the photoelectric conversion portion 2.

For example, a transparent rigid material such as a soda glass, quartz glass, Pyrex (registered trademark), or synthetic quartz plate, a transparent resin plate or film material, or the like is suitably used as the substrate material having a high light transmittance. A glass substrate is preferably used from the standpoint of having chemical and physical stability.

A surface of the substrate 1 on the photoelectric conversion portion 2 side may have a fine irregular structure so that incident light is effectively diffusely reflected on the surface of the photoelectric conversion portion 2. This fine irregular structure can be formed by a known method such as a reactive ion etching (RIE) process or a blast process.

2. Photoelectric Conversion Portion

The photoelectric conversion portion 2 has a light-receiving surface and a back surface. The first electrolysis electrode 8 and the second electrolysis electrode 7 are provided on the back surface of the photoelectric conversion portion 2. When the photoelectric conversion portion 2 receives light, a potential difference is generated between the first area and the second area on the back surface of the photoelectric conversion portion 2. Note that the term "light-receiving surface" is a surface that receives light for photoelectric conversion, and the term "back surface" refers to a back surface of the light-receiving surface. Alternatively, the photoelectric conversion portion 2 may be provided on the substrate 1 so that the light-receiving surface is disposed on the lower side.

The photoelectric conversion portion 2 is not particularly limited as long as charge separation can be caused by the incident light and a potential difference is generated between the first area and the second area on the back surface. Examples of the photoelectric conversion portion 2 include a photoelectric conversion portion using a silicon semiconductor, a photoelectric conversion portion using a compound semiconductor, and a photoelectric conversion portion using an organic semiconductor.

In an example of a method for forming the photoelectric conversion portion 2 in which an electromotive force is generated between the first area and the second area on the back surface, a semiconductor wafer is used as a material, and a p-type semiconductor portion 4 and an n-type semiconductor portion 5 are formed so that a part of the p-type semiconductor portion 4 and a part of the n-type semiconductor portion 5 are formed on the back surface of the semiconductor wafer. When light is incident from a light-receiving surface of the photoelectric conversion portion 2 thus prepared, a potential difference can be generated between an area where the p-type semiconductor portion 4 is formed and an area where the n-type semiconductor portion 5 is formed, the areas being disposed on the back surface of the photoelectric conversion portion. Note that the term "semiconductor substrate" in the present invention encompasses a substrate obtained by processing a semiconductor wafer.

When the p-type semiconductor portion 4 and the n-type semiconductor portion 5 are formed in a semiconductor wafer so as to contact each other, a p-n junction can be formed in the photoelectric conversion portion. When the p-type semiconductor portion 4 and the n-type semiconductor portion 5 are formed in a semiconductor wafer composed of an i-type semiconductor so as not to contact each other, a p-i-n junction can be formed in the photoelectric conversion portion. When a semiconductor wafer composed of a p-type semiconductor is used, a photoelectric conversion portion 2 having an n-p-p$^+$ junction can be formed. When a semiconductor wafer composed of an n-type semiconductor is used, a photoelectric conversion portion 2 having a p-n-n$^+$ junction can be formed.

Figure 5:
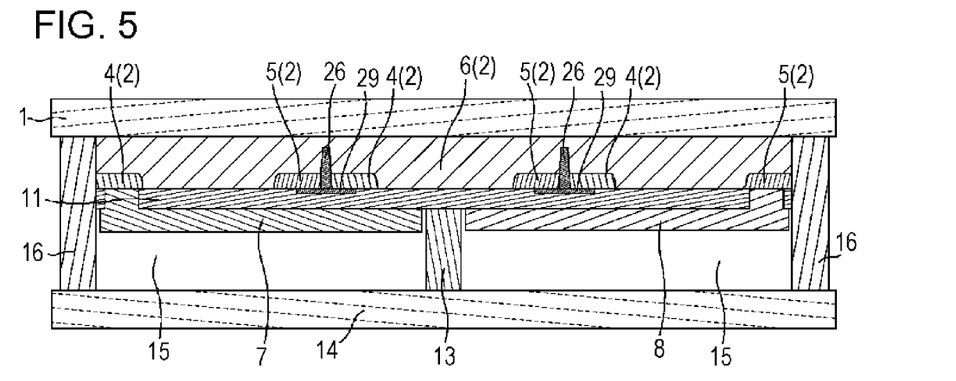
FIG. 5 is a schematic cross-sectional view illustrating a structure of a hydrogen production device according to an embodiment of the present invention.
Figure 7:
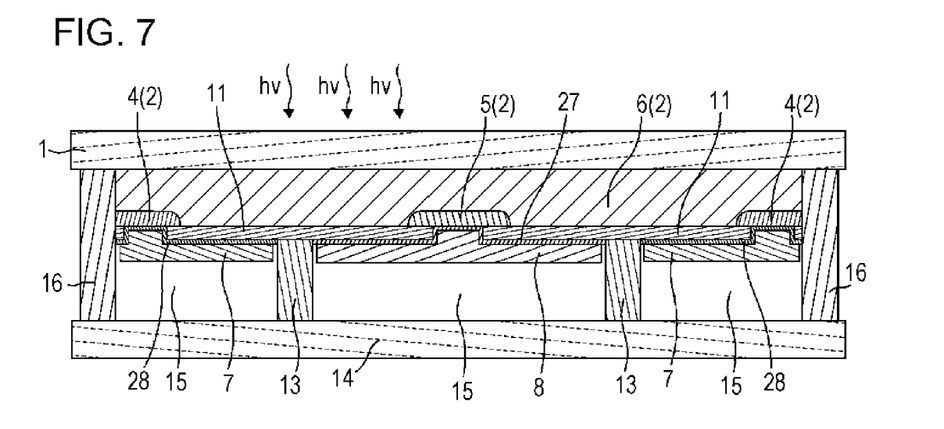
FIG. 7 is a schematic cross-sectional view taken along dotted line B-B of FIG. 6.

As illustrated in FIG. 2, one p-type semiconductor portion 4 and one n-type semiconductor portion 5 may be formed in a semiconductor wafer. Alternatively, as illustrated in FIG. 5, a plurality of p-type semiconductor portions 4 and a plurality of n-type semiconductor portions may be formed in a semiconductor wafer. Alternatively, as illustrated in FIG. 7, one portion out of the p-type semiconductor portion 4 and the n-type semiconductor portion 5 may be formed at one position of a semiconductor wafer, and the other portion may be formed at two positions to the left and right of the one portion.

The semiconductor wafer used as the material of the photoelectric conversion portion 2 is not particularly limited as long as a p-n junction, a p-i-n junction, an n-p-p$^+$ junction, or a p-n-n$^+$ junction is formed and photoelectric conversion can be performed. An example of the semiconductor wafer is a silicon wafer. A single-crystal semiconductor wafer or a polycrystalline semiconductor wafer may be used as the semiconductor wafer.

The method or forming the p-type semiconductor portion 4 and the n-type semiconductor portion 5 is not particularly limited. Examples thereof include a method in which a p-type impurity and an n-type impurity are thermally diffused in a semiconductor wafer and a method in which a p-type impurity and an n-type impurity are ion-implanted in a semiconductor wafer. The p-type impurity and the n-type impurity are thermally diffused or ion-implanted from a surface of a semiconductor wafer by any of the above methods, whereby the p-type semiconductor portion 4 and the n-type semiconductor portion 5 can be formed. Thus, a part of the p-type semiconductor portion 4 and a part of the n-type semiconductor portion 5 can be formed on a back surface of the photoelectric conversion portion 2.

The photoelectric conversion portion 2 outputs an electromotive force generated by receiving light to the hydrogen generation portion and the oxygen generation portion, and decomposes water. Therefore, it is necessary to use a material that generates an electromotive force necessary for generating hydrogen and oxygen in the hydrogen generation portion and the oxygen generation portion, respectively. The potential difference between the hydrogen generation portion and the oxygen generation portion needs to be larger than the theoretical voltage (1.23 V) for decomposition of water. For this purpose, it is necessary to generate a sufficiently large potential difference in the photoelectric conversion portion 2. Therefore, in the photoelectric conversion portion 2, two or more portions that generate an electromotive force, such as, two or more p-n junctions, are preferably connected in series.

Figure 4:
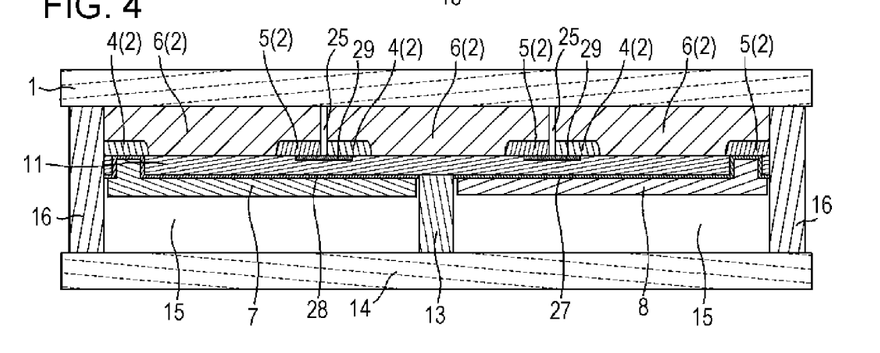
FIG. 4 is a schematic cross-sectional view illustrating a structure of a hydrogen production device according to an embodiment of the present invention.
Figure 8:
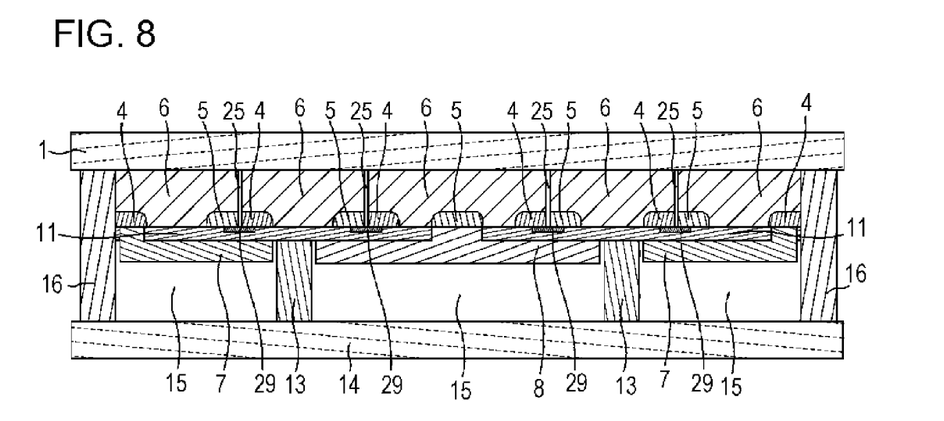
FIG. 8 is a schematic cross-sectional view illustrating a structure of a hydrogen production device according to an embodiment of the present invention.

The photoelectric conversion portion 2 may have a plurality of p-i-n junctions, p-n junctions, n-p-p$^+$ junctions, or p-n-n$^+$ junctions that are connected in series. This structure can increase the electromotive force generated when the photoelectric conversion portion 2 receives light, and thus an electromotive force necessary for decomposition of water can be output to the first electrolysis electrode 8 and the second electrolysis electrode 7. The method for forming the photoelectric conversion portion 2 having a plurality of p-i-n junctions or the like that are connected in series is not particularly limited. For example, as illustrated in FIGS. 4 and 8, such a photoelectric conversion portion 2 can be formed by arranging, in parallel, semiconductor wafers each having a p-type semiconductor portion 4 and a n-type semiconductor portion 5 thereon; and connecting adjacent semiconductor wafers to each other through a third conductive portion 29. Alternatively, as illustrated in FIG. 5, such a photoelectric conversion portion 2 can be obtained by forming a plurality of portions of a semiconductor wafer, the portions being divided by trench isolations 26; forming a p-type semiconductor portion 4 and a n-type semiconductor portion 5 in each of the portions; and then connecting adjacent portions to each other through a third conductive portion 29.

In this embodiment, a photoelectric conversion portion 2 formed using a semiconductor wafer has been described. Alternatively, the photoelectric conversion portion 2 may be formed using a semiconductor thin film, an organic semiconductor, or the like as long as a potential difference is generated between two areas on the back surface.

3. Insulating Portion

The insulating portion 11 may be provided in a portion between the back surface of the photoelectric conversion portion 2 and the first electrolysis electrode 8 and a portion between the back surface of the photoelectric conversion portion 2 and the second electrolysis electrode 7. This structure can increase the distance between the first area on the back surface of the photoelectric conversion portion 2, the first area being electrically connected to the first electrolysis electrode 8, and the second area on the back surface of the photoelectric conversion portion 2, the second area being electrically connected to the second electrolysis electrode 7. Consequently, the photoelectric conversion efficiency of the photoelectric conversion portion 2 can be increased. Furthermore, in the case where the photoelectric conversion portion 2 has p-i-n junctions or the like that are connected in series, the formation of the insulating portion 11 can prevent the generation of a leakage current.

The insulating portion 11 is not formed on the first area on the back surface of the photoelectric conversion portion 2, the first area being electrically connected to the first electrolysis electrode 8, and the second area on the back surface of the photoelectric conversion portion 2, the second area being electrically connected to the second electrolysis electrode 7. Accordingly, the first electrolysis electrode 8 can be formed on the first area, the second electrolysis electrode 7 can be formed on the second area, and the p-type semiconductor portion 4 or the n-type semiconductor portion 5 can be electrically connected to the first electrolysis electrode 8 or the second electrolysis electrode 7 with the first or second area therebetween. For example, as illustrated in FIGS. 2, 5, and 8, openings of the insulating portion 11 may be provided on the second area on the back surface of the photoelectric conversion portion 2, the second area being a part of the p-type semiconductor portion 4, and the first area on the back surface of the photoelectric conversion portion 2, the first area being a part of the n-type semiconductor portion 5, the first electrolysis electrode 8 may be provided in the opening on the first area and on the insulating portion 11, and the second electrolysis electrode 7 may be provided in the opening on the second area and on the insulating portion 11.

A first conductive portion 27 may be provided on the photoelectric conversion portion side of the first electrolysis electrode 8 so as to contact the first electrolysis electrode 8. A second conductive portion 28 may be provided on the photoelectric conversion portion side of the second electrolysis electrode 7 so as to contact the second electrolysis electrode 7. For example, as illustrated in FIGS. 4 and 7, the first conductive portion 27 may be provided between the inner wall of an opening of the insulating portion 11 on the first area and the first electrolysis electrode 8 and between the insulating portion 11 and the first electrolysis electrode 8, and the second conductive portion 28 may be provided between the inner wall of an opening of the insulating portion 11 on the second region and the second electrolysis electrode 7 and between the insulating portion 11 and the second electrolysis electrode 7. The first conductive portion 27 and the second conductive portion 28 may be composed of a material having a high electrical conductivity. Thus, the internal resistance can be reduced when an electromotive force generated as a result of reception of light by the photoelectric conversion portion 2 is output to the first electrolysis electrode 8 and the second electrolysis electrode 7.

The first conductive portion 27 and the second conductive portion 28 are not particularly limited as long as they have electrical conductivity. For example, the first conductive portion 27 and the second conductive portion 28 are each a metal thin film. For example, the first conductive portion 27 and the second conductive portion 28 are each a thin film composed of Al, Ag, Au or the like. These thin films may be formed by, for example, sputtering. For example, the first conductive portion 27 and the second conductive portion 28 are each a transparent conductive film composed of In—Zn—O (IZO), In—Sn—O (ITO), ZnO—Al, Zn—Sn—O, $SnO_2$, or the like.

The insulating portion 11 may be composed of either an organic material or an inorganic material. For example, the organic material may be an organic polymer such as polyamide, polyimide, polyarylene, an aromatic vinyl compound, a fluorine-containing polymer, an acrylic polymer, or a vinyl amide polymer. The inorganic material may be a metal oxide such as $Al_2O_3$, $SiO_2$ such as a porous silica film, a fluorine-doped silicon glass film (FSG), SiOC, a hydrogen silsesquioxane (HSQ) film, $SiN_x$, or silanol ($Si(OH)_4$). Each of the materials may be dissolved in a solvent such as an alcohol, and the resulting solution may be applied and heated to form a film.

Examples of the method for forming the insulating portion 11 include a method in which a paste containing an insulating material is applied by a screen printing method, an ink-jet method, a spin coating method, or the like, and the applied paste is then dried or baked; a method for depositing a film by chemical vapor deposition (CVD) or the like using a raw material gas; and methods for forming a film by physical vapor deposition (PVD), vacuum evaporation, sputtering, or a sol-gel method.

4. First Electrolysis Electrode and Second Electrolysis Electrode

The first electrolysis electrode 8 and the second electrolysis electrode 7 are provided on the back surface of the photoelectric conversion portion 2. The first electrolysis electrode 8 and the second electrolysis electrode 7 become respectively electrically connected to the first area and the second area where a potential difference is generated as a result of reception of light by the photoelectric conversion portion 2, the first and second areas being located on the back surface of the photoelectric conversion portion 2. With this structure, the electromotive force generated as a result of reception of light by the photoelectric conversion portion 2 is output to the first electrolysis electrode 8 and the second electrolysis electrode 7.

One of the first electrolysis electrode 8 and the second electrolysis electrode 7 functions as a hydrogen generation portion that generates $H_2$ from an electrolyte solution using the electromotive force generated as a result of reception of light by the photoelectric conversion portion 2. The other electrolysis electrode functions as an oxygen generation portion that generates $O_2$ from the electrolyte solution using the electromotive force.

Figure 6:
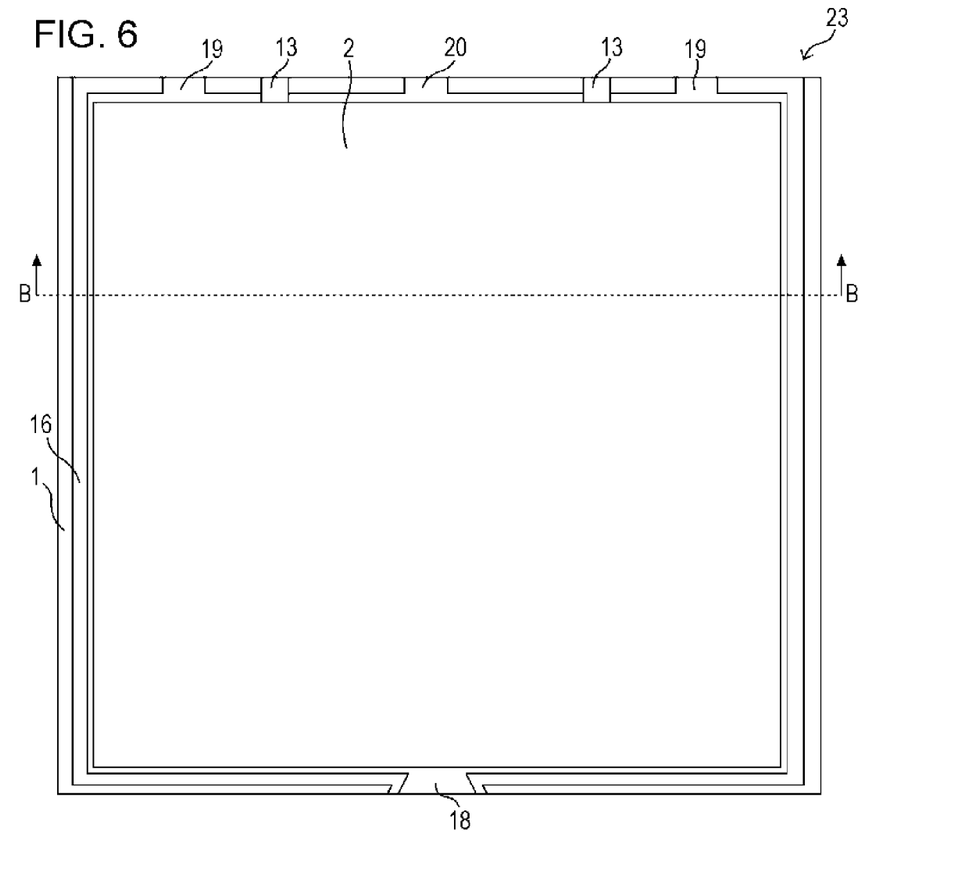
FIG. 6 is a schematic plan view illustrating a structure of a hydrogen production device according to an embodiment of the present invention.

The first electrolysis electrode 8 and the second electrolysis electrode 7 may be arranged in parallel, and a partition wall 13 may be provided between the first electrolysis electrode 8 and the second electrolysis electrode 7. One first electrolysis electrode 8 and one second electrolysis electrode 7 may be provided as illustrated in FIGS. 1 to 5. A plurality of first electrolysis electrodes 8 and a plurality of second electrolysis electrodes 7 may be provided. The first electrolysis electrodes 8 and the second electrolysis electrodes 7 may be alternately arranged. Alternatively, as illustrated in FIGS. 6 to 8, one of the first electrolysis electrode 8 and the second electrolysis electrode 7 may be arranged, and the other electrolysis electrode may be arranged on both sides of the one electrolysis electrode.

Furthermore, the first electrolysis electrode 8 and the second electrolysis electrode 7 may be provided on an inner wall of the electrolyte solution path 15. With this structure, the first electrolysis electrode 8 and the second electrolysis electrode 7 can be brought into contact with an electrolyte solution, and hydrogen and oxygen can be generated from the electrolyte solution.

5. Hydrogen Generation Portion

The hydrogen generation portion is a portion that generates $H_2$ from an electrolyte solution. One of the first electrolysis electrode 8 and the second electrolysis electrode 7 functions as the hydrogen generation portion. The hydrogen generation portion may contain a catalyst for a reaction to generate $H_2$ from an electrolyte solution. In this case, the reaction rate of the reaction to generate $H_2$ from an electrolyte solution can be increased. The hydrogen generation portion may include only a catalyst for the reaction to generate $H_2$ from an electrolyte solution. Alternatively, the hydrogen generation portion may further include a support on which the catalyst is supported. The hydrogen generation portion may have a catalyst surface area larger than the area of the light-receiving surface of the photoelectric conversion portion 2. In this case, the rate of reaction to generate $H_2$ from an electrolyte solution can be further increased. The hydrogen generation portion may be composed of a porous conductor on which a catalyst is supported. In this case, the catalyst surface area can be increased. In addition, it is possible to suppress a change in the electric potential due to a current flowing between the light-receiving surface or the back surface of the photoelectric conversion portion 2 and the catalyst contained in the hydrogen generation portion. In the case where the first electrolysis electrode 8 functions as the hydrogen generation portion, even if the second electrode is omitted, it is possible to suppress a change in the electric potential due to a current flowing between the back surface of the photoelectric conversion portion 2 and the catalyst. The hydrogen generation portion may include, as a hydrogen generation catalyst, at least one of Pt, Ir, Ru, Pd, Rh, Au, Fe, Ni, and Se.

The catalyst for the reaction to generate $H_2$ from an electrolyte solution (hydrogen generation catalyst) is a catalyst that promotes conversion from two protons and two electrons to one hydrogen molecule, and can be a material that is chemically stable and that has a low hydrogen generation overvoltage. Preferred examples thereof include platinum group metals having catalytic activity to hydrogen, such as Pt, Ir, Ru, Pd, Rh, and Au, alloys thereof, and compounds thereof; alloys and compounds of Fe, Ni, and Se each of which constitutes the active center of hydrogenase which is a hydrogen generating enzyme; and combinations thereof. Among these, Pt and nanostructures containing Pt have a low hydrogen generation overvoltage, and thus can be suitably used. Materials such as CdS, CdSe, ZnS, and $ZrO_2$ with which a hydrogen generation reaction is caused by light irradiation may also be used.

The hydrogen generation catalyst may be directly supported on, for example, the back surface of the photoelectric conversion portion 2. However, in order to further increase the reaction area and to improve the gas generation rate, the catalyst may be supported on a conductor. Examples of the conductor for supporting the catalyst include metal materials, carbonaceous materials, and inorganic materials having electrical conductivity.

The metal materials are preferably materials having electron conductivity and having corrosion resistance in an acidic atmosphere. Specific examples thereof include noble metals such as Au, Pt, and Pd; metals such as Ti, Ta, W, Nb, Ni, Al, Cr, Ag, Cu, Zn, Su, and Si, nitrides and carbides of these metals; stainless steels; and alloys such as Cu—Cr, Ni—Cr, and Ti—Pt. The metal materials more preferably contain at least one element selected from the group consisting of Pt, Ti, Au, Ag, Cu, Ni, and W from the standpoint that other chemical side reactions hardly occur. These metal materials each have a relatively low electric resistance and can suppress a decrease in the voltage even when a current is taken in a surface direction. When a metal material having poor corrosion resistance in an acidic atmosphere, such as Cu, Ag, or Zn, is used, the surface of the metal material having poor corrosion resistance may be coated with a noble metal or a metal having corrosion resistance such as Au, Pt, or Pd, carbon, graphite, glassy carbon, a conductive polymer, a conductive nitride, a conductive carbide, a conductive oxide, or the like.

As the carbonaceous materials, materials that are chemically stable and that have electrical conductivity are preferred. Examples thereof include carbon powders and carbon fibers such as acetylene black, Vulcan, ketjen black, furnace black, vapor-grown carbon fibers (VGCFs), carbon nanotubes, carbon nanohorns, and fullerenes.

Examples of the inorganic materials having electrical conductivity include In—Zn—O (IZO), In—Sn—O (ITO), ZnO—Al, Zn—Sn—O, $SnO_2$, and antimony oxide-doped tin oxide.

Furthermore, examples of the conductive polymer include polyacetylene, polythiophene, polyaniline, polypyrrole, polyparaphenylene, and poly(para-phenylene vinylene). Examples of the conductive nitride include carbon nitride, silicon nitride, gallium nitride, indium nitride, germanium nitride, titanium nitride, zirconium nitride, and thallium nitride. Examples of the conductive carbide include tantalum carbide, silicon carbide, zirconium carbide, titanium carbide, molybdenum carbide, niobium carbide, iron carbide, nickel carbide, hafnium carbide, tungsten carbide, vanadium carbide, and chromium carbide. Examples of the conductive oxide include tin oxide, indium tin oxide (ITO), or antimony oxide-doped tin oxide.

The structure of the conductor for supporting the hydrogen generation catalyst may be preferably a plate shape, a foil shape, a rod shape, a mesh shape, a lath plate shape, a porous plate shape, a porous rod shape, a woven fabric shape, a nonwoven fabric shape, a fiber shape, or a felt shape. In addition, a conductor having grooves, the conductor being produced by pressing a surface of a felt-shaped electrode so as to have grooves, is preferably used because the electric resistance and the flow resistance of an electrode liquid can be reduced.

6. Oxygen Generation Portion

The oxygen generation portion is a portion that generates $O_2$ from an electrolyte solution. One of the first electrolysis electrode 8 and the second electrolysis electrode 7 functions as the oxygen generation portion. The oxygen generation portion may contain a catalyst for a reaction to generate $O_2$ from an electrolyte solution. In this case, the reaction rate of the reaction to generate $O_2$ from an electrolyte solution can be increased. The oxygen generation portion may include only a catalyst for the reaction to generate $O_2$ from an electrolyte solution. Alternatively, the oxygen generation portion may further include a support on which the catalyst is supported. The oxygen generation portion may have a catalyst surface area larger than the area of the light-receiving surface of the photoelectric conversion portion 2. In this case, the rate of reaction to generate $O_2$ from an electrolyte solution can be further increased. The oxygen generation portion may be composed of a porous conductor on which a catalyst is supported. In this case, the catalyst surface area can be increased. In addition, it is possible to suppress a change in the electric potential due to a current flowing between the light-receiving surface or the back surface of the photoelectric conversion portion 2 and the catalyst contained in the oxygen generation portion. In the case where the first electrolysis electrode 8 functions as the hydrogen generation portion, even if the second electrode is omitted, it is possible to reduce a change in the electric potential due to a current flowing between the back surface of the photoelectric conversion portion 2 and the catalyst. The oxygen generation portion may include, as an oxygen generation catalyst, at least one of Mn, Ca, Zn, Co, and Ir.

The catalyst for the reaction to generate $O_2$ from an electrolyte solution (oxygen generation catalyst) is a catalyst that promotes conversion from two water molecules to one oxygen molecule, four protons, and four electrons, and can be a material that is chemically stable and that has a low oxygen generation overvoltage. Examples thereof include oxides and compounds containing Mn, Ca, Zn, or Co serving as the active center of Photosystem II, which is an enzyme to catalyze the reaction to generate oxygen from water using light; compounds containing a platinum group metal, such as Pt, $RuO_2$, and $IrO_2$; oxides and compounds containing a transition metal such as Ti, Zr, Nb, Ta, W, Ce, Fe, or Ni, and combinations of the above materials. Among these, iridium oxide, manganese oxide, cobalt oxide, or cobalt phosphate are suitably used because the overvoltage is low and the oxygen generation efficiency is high.

The oxygen generation catalyst may be directly supported on the light-receiving surface or the back surface of the photoelectric conversion portion 2. However, in order to further increase the reaction area and to improve the gas generation rate, the catalyst may be supported on a conductor. Examples of the conductor for supporting the catalyst include metal materials, carbonaceous materials, and inorganic materials having electrical conductivity. The explanation regarding the hydrogen generation catalyst described in "5. Hydrogen generation portion" applies to the explanation of the above conductor as long as there is no inconsistency.

When the catalytic activities of the single hydrogen generation catalyst and the single oxygen generation catalyst are low, a co-catalyst may also be used. Examples of the co-catalyst include oxides and compounds of Ni, Cr, Rh, Mo, Co, or Se.

Examples of the method for supporting the hydrogen generation catalyst or the oxygen generation catalyst include a method in which the catalyst is directly applied onto a conductor or a semiconductor; dry coating methods such as PVD methods, e.g., a vacuum evaporation method, a sputtering method, and an ion plating method, and CVD methods; and an electrolytic deposition method. These methods can be appropriately selected in accordance with the material used. A conductive substance may be appropriately supported between the photoelectric conversion portion and the catalyst. Furthermore, when the catalytic activities for hydrogen generation and oxygen generation are not sufficient, the catalyst may be supported on a porous body, a fibrous substance, or a nanoparticle of a metal, carbon, or the like to increase the reaction surface area, thereby improving the hydrogen generation rate and the oxygen generation rate.

7. Top Plate

The top plate 14 may be provided over the first electrolysis electrode 8 and the second electrolysis electrode 7 so as to face the substrate 1. The top plate 14 may be provided such that a space is formed between the plate 14, and the first electrolysis electrode 8 and second electrolysis electrode 7.

The top plate 14 constitutes a flow path of the electrolyte solution or the like and is provided to confine the generated hydrogen and oxygen. Therefore, the top plate 14 is preferably composed of a substance having high air-tightness. The material of the top plate 14 is not particularly limited and may be transparent or opaque. However, a transparent material is preferable from the standpoint that the generation of hydrogen and oxygen can be visually observed. The transparent top plate is not particularly limited. Examples thereof include transparent rigid materials such as quartz glass, Pyrex (registered trademark), and a synthetic quartz plate; transparent resin plates; and transparent resin films. Among these, glass materials are preferably used from the standpoint that they do not have gas permeability and are chemically and physically stable.

8. Partition Wall

The partition wall 13 can be provided so as to separate a space between the first electrolysis electrode 8 and the top plate 14 from a space between the second electrolysis electrode 7 and the top plate 14. With this structure, hydrogen and oxygen generated in the first electrolysis electrode 8 and the second electrolysis electrode 7 are prevented from being mixed, and thus the hydrogen and oxygen can be separately collected.

The partition wall 13 may contain an ion exchanger. In this case, it is possible to keep the proton concentration constant, the proton concentration having become unbalanced between the electrolyte solution in the space between the first electrolysis electrode 8 and the top plate 14, and the electrolyte solution in the space between the second electrolysis electrode 7 and the top plate 14. Specifically, proton ions are moved through the partition wall 9 to eliminate the imbalance in the proton concentration.

For example, the partition wall 13 may be provided so as to be in contact with the top plate 14 as illustrated in FIG. 2, or may be provided so as to leave a space between the top plate 14 and the partition wall 13. The partition wall 13 may have a hole. In this case, the imbalance of protons can be more easily eliminated. Even when a space is provided between the top plate 14 and the partition wall 13, hydrogen and oxygen can be prevented from being mixed by disposing the hydrogen production device so that the light-receiving surface of the photoelectric conversion portion 2 faces upward. In addition, hydrogen and oxygen can be prevented from being mixed by providing a hole in a portion of the partition wall 13 closer to the top plate 14.

In FIG. 2, the partition wall 13 completely separates the electrolyte solution path 15 between the first electrolysis electrode 8 and the top plate 14, and the electrolyte solution path 15 between the second electrolysis electrode 7 and the top plate 14. Alternatively, the partition wall 13 may be provided so as to form a gas flow path as long as there is no interruption in ion movement between the above electrolyte solution paths. In this case, the partition wall 13 can be formed by a lower-cost method such as a printing method so that hydrogen and oxygen generated are not mixed. In this case, the substrate 1 and the top plate 14 are connected through the sealing member 16. In order to increase stability of the structure, the partition wall 9 may be provided so as to partially contact the top plate 14.

A ratio between the amount of hydrogen and the amount of oxygen generated from the electrolyte solution is 2:1 in terms of molar ratio, and the amount of gas generated differs between the first electrolysis electrode 8 and the second electrolysis electrode 7. Therefore, in order to keep the water content in the device constant, the partition wall 13 is preferably composed of a material through which water permeates. The partition wall 13 may be an inorganic membrane composed of porous glass, porous zirconia, or porous alumina, or an ion exchanger.

The ion exchange may be any ion exchanger that is well known in this field, and a proton-conductive membrane, a cation exchange membrane, an anion exchange membrane, or the like may be used.

The material of the proton-conductive membrane is not particularly limited as long as the material has proton conductivity and an electrical insulation property. A polymer membrane, an inorganic membrane, or a composite membrane may be used.

Examples of the polymer membrane include perfluorosulfonic acid electrolyte membranes such as Nafion (registered trademark) manufactured by Du Pont, Aciplex (registered trademark) manufactured by Asahi Kasei Corporation, and Flemion (registered trademark) manufactured by Asahi Glass Co., Ltd.; and hydrocarbon electrolyte membranes composed of polystyrene sulfonate, sulfonated polyether ether ketone, or the like.

Examples of the inorganic membranes include membranes composed of phosphate glass, cesium hydrogen sulfate, polytungstophosphoric acid, ammonium polyphosphate, or the like. Examples of the composite membrane include membranes composed of an inorganic substance such as a sulfonated polyimide polymer or tungstic acid and an organic substance such as polyimide. Specific examples thereof include a GORE-SELECT membrane (registered trademark) manufactured by W. L. Gore & Associates Inc. and a pore-filling electrolyte membrane. Furthermore, in the case where the membrane is used in a high-temperature environment (for example, at 100° C. or higher), the material may be sulfonated polyimide, 2-acrylamide-2-methylpropane sulfonate (AMPS), sulfonated polybenzimidazole, phosphonated polybenzimidazole, cesium hydrogen sulfate, ammonium polyphosphate, or the like.

The cation exchange membrane may be a solid polymer electrolyte through which a cation can move. Specific examples of the cation exchange membrane include fluorine-containing ion exchange membranes such as a perfluorocarbon sulfonic acid membrane and a perfluorocarbon carboxylic acid membrane; a polybenzimidazole membrane impregnated with phosphoric acid, a polystyrene sulfonate membrane, and a sulfonated styrene-vinylbenzene copolymer membrane.

When the anion transport number of a supporting electrolyte solution is high, an anion-exchanging membrane is preferably used. As the anion-exchanging membrane, a solid polymer electrolyte through which an anion can move can be used. Specific examples thereof include a poly(orthophenylenediamine) membrane, a fluorine-containing ion exchanging membrane having an ammonium salt derivative group, a vinylbenzene polymer membrane having an ammonium salt derivative group, and a membrane prepared by aminating a chloromethylstyrene-vinylbenzene copolymer.

When the hydrogen generation and the oxygen generation are selectively performed by the hydrogen generation catalyst and the oxygen generation catalyst, respectively, and the ions are moved accordingly, a member, such as a special membrane for the ion exchange, is not necessarily arranged. For the purpose of only physically separating the gas, an ultraviolet-curable resin or a thermosetting resin, which will be described below in the sealing member, can be used.

9. Sealing Member

The sealing member 16 is a member that bonds the substrate 1 and the top plate 14 and that seals the electrolyte solution flowing in the hydrogen production device 23, and hydrogen and oxygen generated in the hydrogen production device 23. For example, the sealing member 16 is preferably an ultraviolet-curable adhesive, a thermosetting adhesive, or the like, but the type of the adhesive is not limited. Ultraviolet-curable adhesives are resins which are polymerized by being irradiated with light having a wavelength of 200 to 400 nm and cured in several seconds after the light irradiation. Ultraviolet-curable adhesives are classified into radical polymerization resins and cationic polymerization resins. Examples of the radical polymerization resins include acrylates and unsaturated polyesters. Examples of the cation polymerization resins include epoxy, oxetane, and vinyl ether. Examples of the thermosetting polymer adhesives include organic resins such as a phenolic resin, an epoxy resin, a melamine resin, a urea resin, and a thermosetting polyimide. Thermosetting polymer adhesives satisfactorily bond members by being heated and polymerized under pressure during thermocompression and then being cooled to room temperature while being pressed, and thus a fastening member or the like is not necessary. Besides the organic resins, a hybrid material having high adhesion to a glass substrate can be used. By using such a hybrid material, mechanical characteristics such as the elastic modulus and hardness are improved, and thermal resistance and chemical resistance are significantly improved. The hybrid material contains inorganic colloidal particles and an organic binder resin. An example of the hybrid material contains inorganic colloidal particles such as silica, and an organic binder resin such as an epoxy resin, a polyurethane acrylate resin, or a polyester acrylate resin.

In this embodiment, the sealing member 16 is shown. However, the member is not limited as long as it has a function of bonding the substrate 1 to the top plate 14. For example, it is also possible to appropriately employ a method in which a resin or metal gasket is used and air tightness is enhanced by physically applying a pressure from the outside using a member such as a screw.

10. Electrolyte Solution Path

The electrolyte solution path 15 can be the space between the first electrolysis electrode 8 and the top plate 14, and the space between the second electrolysis electrode 7 and the top plate 14. In addition, the electrolyte solution path 15 can be separated by the partition wall 13.

In order to efficiently remove bubbles of generated hydrogen and oxygen from the first electrolysis electrode 8 or the second electrolysis electrode 7, a simple device for circulating the electrolyte solution in the electrolyte solution path, for example, a pump, a fan, or a thermal convection generating device may be provided.

11. Water Inlet, First Gas Outlet, and Second Gas Outlet

The water inlet 18 can be formed by opening a portion of the sealing member 16 in the hydrogen production device 23. The water inlet 18 is arranged in order to replenish water to be converted to hydrogen and oxygen. The position and the shape of the water inlet 18 are not particularly limited as long as the water used as a raw material can be efficiently supplied to the hydrogen production device. However, the water inlet 18 is preferably provided at a lower portion of the hydrogen production device in view of flowability and the ease of supply of water.

The first gas outlet 20 and the second gas outlet 19 can be formed by opening upper portions of the sealing member 16 in the hydrogen production device 23 when the hydrogen production device 23 is installed such that the water inlet 18 is located on the lower side. The first gas outlet 20 and the second gas outlet 19 may be respectively provided on the first electrolysis electrode 20 side and the second electrolysis electrode 19 side so that the partition wall 13 is disposed therebetween.

12. Electrolyte Solution

The electrolyte solution is an aqueous solution containing an electrolyte. Examples thereof include an electrolyte solution containing 0.1 M of $H_2SO_4$ and a buffering solution containing 0.1 M of potassium phosphate.

Method for Producing Hydrogen with Hydrogen Production Device

By providing the water inlet 18, the first gas outlet 20, and the second gas outlet 19, the hydrogen production device 23 can be installed such that the light-receiving surface of the photoelectric conversion portion 2 is tilted with respect to a horizontal surface in a state where the light-receiving surface faces upward, and the water inlet 18 is located on the lower side, and the first gas outlet 20 and the second gas outlet 19 are located on the upper side. By installing the hydrogen production device 23 in this manner, an electrolyte solution can be introduced from the water inlet 18 into the hydrogen production device 23 to fill the electrolyte solution path 15 with the electrolyte solution. When light enters the hydrogen production device 23 in this state, hydrogen and oxygen can be continuously generated in the hydrogen generation portion and the oxygen generation portion, respectively. The generated hydrogen and oxygen can be separated by the partition wall 13, and the hydrogen and oxygen rise to an upper portion of the hydrogen production device 23, and can be collected from the first gas outlet 20 and the second gas outlet 19.

INDUSTRIAL APPLICABILITY

A hydrogen production device according to the present invention is used as an energy-creating device that produces hydrogen and oxygen by decomposing water with solar energy. Thus, hydrogen can be produced on-site at home, in a hydrogen station, and a large-scale hydrogen production plant.

REFERENCE SIGNS LIST

1: substrate, 2: photoelectric conversion portion, 4: p-type semiconductor portion, 5: n-type semiconductor portion, 6: semiconductor portion, 7: second electrolysis electrode, 8: first electrolysis electrode, 11: insulating portion, 13: partition wall, 14: top plate, 15: electrolyte solution path, 16: sealing member, 18: water inlet, 19: second gas outlet, 20: first gas outlet, 23: hydrogen production device, 25: isolation, 26: trench isolation, 27: first conductive portion, 28: second conductive portion, 29: third conductive portion

The invention claimed is:

1. A hydrogen production device comprising a photoelectric conversion portion having a light-receiving surface and a back surface; a first electrolysis electrode provided on the back surface; and a second electrolysis electrode provided on the back surface, wherein, as a result of reception of light by the photoelectric conversion portion, a potential difference is generated between a first area of the back surface and a second area of the back surface, the first area and the second area are included in the back surface, the first area becomes electrically connected to the first electrolysis electrode, and the second area becomes electrically connected to the second electrolysis electrode, and when the first electrolysis electrode and the second electrolysis electrode contact an electrolyte solution, the first electrolysis electrode forms a hydrogen generation portion that generates $H_2$ from the electrolyte solution using an electromotive force generated as a result of reception of light by the photoelectric conversion portion and the second electrolysis electrode forms an oxygen generation portion that generates $O_2$ from the electrolyte solution using the electromotive force.

2. The device according to claim 1, wherein the photoelectric conversion portion is composed of at least one semiconductor material having an n-type semiconductor portion and a p-type semiconductor portion, and
one of the first area and the second area is a part of the n-type semiconductor portion and the other is a part of the p-type semiconductor portion.

3. The device according to claim 2, further comprising an insulating portion disposed partially between the back surface of the photoelectric conversion portion and the first electrolysis electrode and partially between the back surface and the second electrolysis electrode,
wherein the first electrolysis electrode and the second electrolysis electrode become electrically connected to the n-type semiconductor portion or the p-type semiconductor portion through the first and second areas, respectively, where the insulating portion is not provided.

4. The device according to claim 3, further comprising a first conductive portion that is provided between the insulating portion and the first electrolysis electrode and that becomes electrically connected to the n-type semiconductor portion or the p-type semiconductor portion through the first area, and a second conductive portion that is provided between the insulating portion and the second electrolysis electrode and that becomes electrically connected to the n-type semiconductor portion or the p-type semiconductor portion through the second area.

5. The device according to claim 1, wherein the photoelectric conversion portion has a plurality of p-i-n junctions, p-n junctions, n-p-p$^+$ junctions, or p-n-n$^+$ junctions, and
the p-i-n junctions, the p-n junctions, the n-p-p$^+$ junctions, or the p-n-n$^+$ junctions are connected in series and supply the electromotive force generated by reception of light to the first electrolysis electrode and the second electrolysis electrode.

6. The device according to claim 5, wherein the photoelectric conversion portion includes a plurality of semiconductor substrates each having a p-i-n junction, a p-n junction, an n-p-p$^+$ junction, or a p-n-n$^+$ junction.

7. The device according to claim 1, wherein the hydrogen generation portion includes a catalyst for a reaction to generate $H_2$ from the electrolyte solution, and the oxygen generation portion includes a catalyst for a reaction to generate $O_2$ from the electrolyte solution.

8. The device according to claim 7, wherein at least one of the hydrogen generation portion and the oxygen generation portion has a catalyst surface area larger than the area of the light-receiving surface.

9. The device according to claim 7, wherein at least one of the hydrogen generation portion and the oxygen generation portion is composed of a porous conductor on which a catalyst is supported.

10. The device according to claim 7, wherein the hydrogen generation portion includes, as a hydrogen generation catalyst, at least one of Pt, Ir, Ru, Pd, Rh, Au, Fe, Ni, and Se.

11. The device according to claim 7, wherein the oxygen generation portion includes, as an oxygen generation catalyst, at least one of Mn, Ca, Zn, Co, and Ir.

12. The device according to claim 1, wherein the photoelectric conversion portion is disposed on a light-transmissive substrate,
a top plate is further provided above the first electrolysis electrode and the second electrolysis electrode so as to face the substrate, and
a space is provided between the top plate, and the first electrolysis electrode and second electrolysis electrode.

13. The device according to claim 12, further comprising a partition wall that separates a space between the first electrolysis electrode and the top plate from a space between the second electrolysis electrode and the top plate.

14. The device according to claim 13, wherein the partition wall includes an ion exchanger.

15. The device according to claim 1, wherein the photoelectric conversion portion includes at least one semiconductor substrate having an n-type semiconductor portion and a p-type semiconductor portion,
the n-type semiconductor portion is formed by diffusing or ion-implanting an n-type impurity from the back surface of the semiconductor substrate, and
the p-type semiconductor portion is formed by diffusing or ion-implanting a p-type impurity from the back surface of the semiconductor substrate.

16. The device according to claim 1, wherein the photoelectric conversion portion includes at least one semiconductor substrate having a plurality of p-i-n junctions, p-n junctions, n-p-p$^+$ junctions, or p-n-n$^+$ junctions, and
the p-i-n junctions, the p-n junctions, the n-p-p$^+$ junctions, or the p-n-n$^+$ junctions are separated by a trench isolation.

17. A method for producing hydrogen, comprising arranging the hydrogen production device according to claim 1 such that the light-receiving surface is tilted with respect to a horizontal surface;
introducing an electrolyte solution from a lower portion of the hydrogen production device into the hydrogen production device; causing sunlight to be incident on the light-receiving surface to generate hydrogen and oxygen from the hydrogen generation portion and the oxygen generation portion, respectively; and discharging the hydrogen and oxygen from an upper portion of the hydrogen production device.

* * * * *